United States Patent [19]

Genser

[11] Patent Number: 4,588,455

[45] Date of Patent: May 13, 1986

[54] PLANAR DIFFUSION SOURCE

[75] Inventor: Milton Genser, Short Hills, N.J.

[73] Assignee: Emulsitone Company, Whippany, N.J.

[21] Appl. No.: 641,715

[22] Filed: Aug. 15, 1984

[51] Int. Cl.$^4$ .......................................... H01L 21/223
[52] U.S. Cl. .................................... 148/189; 252/950; 252/951; 148/DIG. 30; 148/186
[58] Field of Search ................... 252/62.3 R, 62.32 B, 252/62.32 T, 950, 951, 186; 148/187, 180, 189, DIG. 30, DIG. 37; 427/99

[56] References Cited

U.S. PATENT DOCUMENTS

| | | |
|---|---|---|
| 3,658,584 | 4/1972 | Schmidt . |
| 3,852,086 | 12/1974 | Murata et al. . |
| 3,923,563 | 12/1975 | Venkatu . |
| 3,931,039 | 1/1976 | Yamashita et al. ........ 252/62.3 R X |
| 3,931,056 | 1/1976 | Myles et al. . |
| 3,954,525 | 5/1976 | Myles et al. . |
| 3,961,969 | 6/1976 | Rapp . |
| 3,962,000 | 6/1976 | Rapp . |
| 3,998,688 | 12/1976 | Florence et al. . |
| 4,025,464 | 5/1977 | Yamashita et al. . |
| 4,033,790 | 7/1977 | Gunjigake et al. . |
| 4,129,090 | 12/1978 | Inaniwa et al. . |
| 4,141,738 | 2/1979 | Rapp . |
| 4,160,672 | 7/1979 | Rapp . |
| 4,175,988 | 11/1979 | Rapp . |
| 4,282,282 | 8/1981 | Rapp . |

*Primary Examiner*—Brian E. Hearn
*Assistant Examiner*—David A. Hey
*Attorney, Agent, or Firm*—Phillips, Moore, Lempio & Finley

[57] ABSTRACT

Planar diffusion sources are provided wherein the source is a wafer of inert material, preferably silicon or silicon dioxide and wherein the wafer acts as a substrate for a surface coating comprising a salt, preferably the oxide, of the dopant element. An inert oxide such as aluminum oxide or silicon dioxide may also be included in the coating. When applied to the substrate as a paste or slurry and fired to suitable temperatures, the dopant oxide coating tightly adheres to the substrate wafer. The coated diffusion source is placed alongside semiconductor wafers in a diffusion furnace; where, at diffusion temperatures, the dopant element volatilizes and diffuses into the surface of the semi-conductor material. The diffusion source can be reused numerous times.

11 Claims, No Drawings

PLANAR DIFFUSION SOURCE

BACKGROUND OF THE INVENTION

The doping of semi-conductor materials is a critical aspect in the production of semi-conductor devices. The electrical properties of semi-conductor substrates such as silicon and germanium, depend upon the diffusion of very carefully controlled minute amounts of suitable impurities into the silicon or germanium crystal structure. Such elements as phosphorus, arsenic, antimony, gallium, boron, aluminum and indium are utilized to create the desired electrical rectification characteristics of the semiconductor material. The type, amount and distribution of impurity in the semi-conductor crystalline structure is absolutely critical to the creation of devices with the desired characteristics.

One of the most popular doping techniques utilized in the industry is the so-called "planar diffusion" method. In this method, the semi-conductor materials, most usually in the form of very thin wafers or disks, perhaps 2, 3 and up to 6 inches in diameter, of the semiconductor material, e.g., silicon, are placed upright in closely spaced slots formed into silica "boats" or support structures. Alternating with the silicon wafers are very thin wafers or disks of the dopant in a suitable chemical form; most usually of a glassy ceramic-like compound, such as boron nitride, aluminum metaphosphate, or the like. Such disks may comprise the doping compound alone; or the doping compound mixed with other inert materials such as $Al_2O_3$ or $SiO_2$, etc. The dopant disks are produced by firing the materials at high temperatures to sinter or even melt them; and then forming compacted masses thereof. The compact masses are then cut and ground to yield wafers of relatively the same dimensions as the semi-conductor wafers.

In any event, the dopant disks are emplaced in the diffusion boats alongside the semi-conductor disks and the entire assemblies are placed into high temperature furnaces. When such furnaces are heated to suitable temperatures, normally in the range of about 700°–1200° C. and in an inert atmosphere such as nitrogen, argon, or helium, the desired chemical species, e.g., B or P, etc. is vaporized from the dopant disk surface. These vapors impinge upon the adjacent semi-conductor disk surfaces where they stick and coat the surface. As the materials remain in the furnace, the desired dopant species gradually diffuses into the interior of the semi-conductor material to thereby alter its electrical properties.

The quantity of dopant and depth of its diffusion into the semi-conductor material can be controlled by proper selection of furnace temperatures and time of residence within the furnace. In any event, such techniques have been extremely successful in producing semi-conductors with the desired electrical properties.

Such planar diffusion techniques are, however, subject to a number of disabilities. These disabilities relate most usually to the physical properties of the dopant disks. Very often the dopant disks are quite brittle and fragile, and the least jarring or bumping will cause them to fracture and break. In other instances the dopant disks are very sensitive to their environment. That is, for some materials, e.g., boron nitrides, the presence of moisture may cause alterations in the crystalline structure whereby dimensional changes occur. These changes may result in cracks or shattering of the disks. Some of the other prior art doping disk materials must be regenerated after one or just a few uses. Most usually the disks must be regenerated in an oxidizing environment to convert these desired elements, e.g. B, into the oxide form in which they are readily vaporized during the diffusion process.

It is obvious that any means to overcome the aforementioned difficulties would present a valuable advance in the art.

BRIEF DESCRIPTION OF THE INVENTION

The present invention relates to improved planar diffusion sources. More particularly the present invention relates to planar diffusion sources that are not as fragile as many previous ceramic based sources; that are not sensitive to moisture or other contaminants in the environment; that may be reused many times without regeneration or with occasional regeneration; and which are generally more economical to produce.

Specifically, the present invention is directed to planar diffusion sources wherein diffusion wafers comprise an inert substrate, preferably silicon or silicon oxide, to which is applied a surface coating of the doping material or materials. The coating is baked or fused onto the substrate to form a tightly adherent surface that can take relatively rough handling without flaking off. These silicon or silica based diffusion wafers can be reused several hundred times without need for regeneration if small amounts of oxygen are included in the doping furnace atmospheres. If oxygen is excluded, it may be necessary to regenerate the disks from time to time by heating in an oxygen atmosphere.

By utilizing different oxides in the surface coatings any desired dopant can be diffused into adjacent semiconductor wafers. Thus, boron oxide, arsenic oxide, antimony oxide, phosphorous oxide, gallium oxide, or indium oxide, can be included in the coating on the diffusion source to provide B, As, Sb, P, Ga, or In, respectively, doping of the adjacent semiconductor materials. Of course, if desired, other dopants could be utilized with equal facility.

It is therefore an object of the invention to provide improved planar diffusion sources.

It is another object of the invention to provide planar diffusion sources wherein an insert substrate material is coated with a dopant.

It is another object of the invention to provide planar diffusion source that can be fabricated to utilize all types of dopant elements.

It is still another object of the invention to provide planar diffusion sources that are durable and reuseable.

Other objects and advantages of the invention will be apparent from a review of the following description and the claims appended hereto.

DETAILED DESCRIPTION OF THE INVENTION

In the invention planar diffusion wafers comprise an inert substrate, generally fabricated from silicon or from silica. The preferred material is silicon. The silicon material is identical to the semi-conductor wafers normally used as the recipient for the doping elements. In fact, a prime source for the silicon substrate wafers are semi-conductor disks which have been rejected for use as furnished semi-conductors. These rejects may be slightly chipped at the edges; they may be improperly or inaccurately cut and/or polished; or they may have surface blemishes that render them unsuitable for use in producing semi-conductor devices. In any event, the preferred substrate material is silicon, although other inert high temperature materials such as silica, can also be advantageously used.

Such substrate materials are procured as wafers having essentially the same shape and dimensions as the disks which are to be doped. Such disks are generally from 2 to 6 inches in diameter, and from about 0.005 to roughly 0.20 inches in thickness. These disks, although quite thin are relatively sturdy and infrangible. As silicon, the substrate disks are readily available from numerous industrial sources, e.g., Monsanto Chemical Co. of St. Louis, Mo., since they are produced in vast quantities during the fabrication of semi-conductor integrated circuit chips.

Onto the silicon disk is deposited a coating of dopant material. The coating is deposited on both sides of the substrate disk. While the thickness of the coating is not critical, it should be thin enough to permit the coated disk to fit into the slots provided in standard boats for supporting disks in diffusion furnaces. The coating should, however, be thick enough to provide a reasonable amount of doping material so that the dopant will be available for many doping runs. Generally, coatings in the range of perhaps 8 to 20 microns (about 0.00025 to 0.0005 inches) are suitable.

The coatings are composed of the active doping materials; and, if desired, some amount of an inert adjunct such as $SiO_2$ or $Al_2O_3$. The particular dopant material is selected in accordance with the chemical species that is intended to be diffused into the semi-conductor material. It is advantageous that the dopant species be in the oxide form in the coating. Thus, in the case of silicon and germanium semi-conductor materials, dopants, such as boron oxide, gallium oxide, and indium oxide are used to produce p-type semi-conductor material; or phosphorous oxide, arsenic oxide, or antimony oxide are used to produce n-type semi-conductor material.

The coating consists of very fine particles, e.g., $1\mu$ or less, of of the desired dopant oxide; and, most usually, an added amount of an inert adjunct such as $Al_2O_3$ or $SiO_2$. The alumina or silica particles are similarly finely ground. They act to modify the volatilization of the dopant molecules at furnace temperatures. That is, the greater the amount of inert adjunct, the less the partial pressure of the dopant at doping temperatures. This enables a finer control of the doping rates to be maintained during the doping operation. Generally the inert $Al_2O_3$ or $SiO_2$ adjunct comprises from 90 to about 50% of the oxide content of the coating.

To produce a tightly adherent coating the finely ground dopant oxide and the diluent oxide, if added, is mixed with a binder material, such as ethyl acetate, cellulose acetate, or the like; and then slurried with an organic solvent such as ethanol with added amounts of water, to produce a thin paste. To produce such a paste, approximately 3 parts of the oxide powder are mixed with 1 part of the liquid component. Other proportions may be used depending upon the method of application and the desired final film thickness.

The dopant film forming mixture is applied to both surfaces of the substrate wafer by either screening, spraying, or spinning. The wafer with its moist coating is then placed in an oven and slowly brought up to temperatures in the range of 900°–1100° C. As the temperature rises, the remaining solvents, if any, evaporate from the film. At even higher temperatures, the binder is also driven off, leaving a coating of the dopant oxide and any inert oxide that may have been added.

The coated disk is maintained at the peak-temperature for about 3 to 4 hours to bake the coating tightly to the underlying substrate. The oven temperature is then slowly reduced over a 3 to 4 hour period back down to ambient. The coated doping disks are then removed and stored for future use. Storage can be in any clean, dust-free place and no special precautions as to moisture or humidity need be taken.

The coating is tightly adherent to the substrate surface, and only ordinary precautions as to cleanliness and bumping need be taken when the coated disks are placed into use.

In use, the dopant source wafers with the desired dopant coatings are placed into standard doping boats alternating with the semi-conductor wafers which are to be doped. The dopant source and semi-conductor disks are placed quite close together, perhaps 0.08 to 0.15 inches apart. Since the source and semi-conductor disks alternate, each face of each semi-conductor disk directly "views" an opposing face of the diffusion source disk.

The boats of alternating diffusion source disks and semi-conductor disks are then placed into a diffusion furnace. An atmosphere of an inert gas, such as nitrogen, is maintained in the furnace. If some oxygen is also included in the inert atmosphere, it is not necessary to regenerate the coated planar diffusion source, even after numerous diffusion procedures. If oxygen is not included in the furnace atmosphere, it may be necessary to regenerate the diffusion source from time to time. Regeneration is accomplished by heating the diffusion source up to diffusion temperatures in an oxygen rich atmosphere.

In any event, the furnace with its inert gas (or inert gas and oxygen) atmosphere is then slowly heated up to diffusion temperatures. Such temperatures may range in the vicinity of 700°–1200° C., with specific temperatures being chosen with regard to the doping species, the semi-conductor material, and the amount and depth of dopant desired in the semi-conductor. Such information is widely known in the art and is readily available in the literature.

Once brought up to temperature the furnace is maintained at the diffusion temperature for a period of time to permit vaporization of the dopant species and transfer thereof to the semi-conductor disks. The longer the furnace is maintained at diffusion temperature, the greater the amount of dopant transfers to the semi-conductor. Also, longer times at temperature result in deeper diffusion of the dopant below the semi-conductor surface. Diffusion times of perhaps 15 minutes up to about an hour are common.

After sufficient time at diffusion temperature has elapsed, the furnace is slowly brought back to ambient, and the boats are removed. The semi-conductor wafers are then removed for further processing. The planar diffusion disks can then be used to dope new semi-conductor disks.

The following examples illustrate the operation of the invention process.

EXAMPLE I

A boron diffusion source was prepared by spreading a paste of $Al_2O_3$ admixed with $B_2O_3$ in an ethyl acetate and ethanol/water vehicle over the surfaces of a silicon disk. The disk was heated up to about 900° C. to remove the organic and liquid components and leave a tigthly adherent $Al_2O_3/B_2O_3$ coating on the disk surfaces.

The dopant disk was then placed in a diffusion furnace along with a silicon disk and the temperature was raised to 950° C. for a period of 15 minutes. The atmosphere in the furnace was 97% $N_2$ and 3% $_2$. The temperature was then reduced to ambient and the silicon disk removed and analyzed for its semi-conductor properties.

The silicon disk exhibited a sheet resistivity of 70 ohms/$cm^2$ and a junction depth of 0.4 microns. An examination of the semi-conductor surface by secondary ion mass spectroscopy did not detect the presence of any aluminum. The spectrometer sensitivity was $10^{16}$ Al atoms/$cm^2$.

EXAMPLE II

A series of tests were run on doping silicon disks with boron. Planar sources prepared in accordance with the Example in I above were used to dope silicon disks. The runs were made at various temperatures and for times of either 15 minutes or 60 minutes. Nitrogen and oxygen atmospheres varying from 99% $N_2$/1% $O_2$ to 50% $N_2$/50% $O_2$ were utilized during the diffusion runs.

Table I below presents results:

TABLE I
Diffusion of B into Si Wafers

| Temperature - °C. | Atmosphere | Time-Minutes | Average Resistivity |
|---|---|---|---|
| 850 | 99% $N_2$/1% $O_2$ | 15 | 46.8 |
| 850 | " | 60 | 37.8 |
| 900 | " | 15 | 30.1 |
| 900 | " | 60 | 22.0 |
| 950 | " | 15 | 15.9 |
| 950 | " | 60 | 11.0 |
| 1000 | " | 15 | 8.8 |
| 1000 | " | 60 | 5.0 |
| 1100 | 90% $N_2$/10% $O_2$ | 15 | 1.8 |
| 1150 | " | 15 | 1.0 |
| 1200 | 50% $N_2$/50% $O_2$ | 15 | 0.5 |

EXAMPLE III

Pastes similar to the paste described in Example I were prepared except that the $B_2O_3$ was replaced by arsenic oxide, antimony oxide, or phosphorous oxide. When diffusion sources were coated with these pastes, and used in accordance with the procedures noted above, diffusions for each element exhibited characteristics of that specific element and no evidence of aluminum doping was found.

When the doping elements Ar, B or P were used, the $Al_2O_3$ could be replaced by $SiO_2$. The oxide of either arsenic, antimony or phosphorous used for doping was mixed with finely ground $SiO_2$ and water and a thickener/binder, such as cellulose acetate, was added to the mixture. The mixture paste was applied to the silicon disk substrate as described hereinbefore.

Such diffusion disks when placed into diffusion furnaces produced doping layers of the described elements on recipient silicon disks.

EXAMPLE IV

A paste consisting of aluminum oxide and zinc oxide in admixture with cellulose acetate, alcohol and water was spread over silicon wafers. The wafers were heated to densify the oxide layer on the silicon and drive off the water and organic binder. The diffusion sources were then placed next to N-type GaAs, or GaAsP disks. The diffusion sources and the recipient materials were heated to 800° C. under an $N_2$ atmosphere. When removed and tested, the GaAs or GaAsP disks exhibited a P-type diffusion layer, thereby indicating that Zn had diffused into the semiconductor surface.

Other variations and adaptations of the invention will be apparent to those skilled in the art.

I claim:

1. A method for effecting the doping of semi-conductor materials comprising coating an inert solid substrate with a solid layer of a composition including an inorganic salt of the dopant element, placing said coated substrate in close proximity to a semi-conductor material to be doped, heating both said coated substrate and semi-conductor material to a temperature sufficiently high to volatilize the dopant element, whereby said dopant migrates to said semi-conductor material and diffuses into said semi-conductor material.

2. The method of claim 1 wherein the substrate is silicon or silicon dioxide.

3. The method of claim 1 wherein the inorganic salt of the dopant element is an oxide.

4. The method of claim wherein the oxide is selected from boron oxide, arsenic oxide, antimony oxide, phosphorous oxide, zinc oxide, gallium oxide, or indium oxide.

5. The method of claim 3 wherein an amount of aluminum oxide is admixed with the inorganic salt of the dopant element.

6. The method of claim 3 wherein an amount of silicon oxide is admixed with the inorganic salt of the dopant element.

7. The method of claim 1 wherein said coating is applied to the substrate in the form of a paste or slurry.

8. The method of claim 7 wherein said paste or slurry includes alcohol, water and a binder material.

9. The method of claim 8 wherein the binder material is an organic thickener.

10. The method of claim 9 wherein the organic thickener is a polysaccharide or polysaccharide salt.

11. The method of claim 1 wherein the substrate and the dopant coating therein is heated to densify the coating and cause the coating to tightly adhere to the substrate.

* * * * *